(12) United States Patent
Rathsack et al.

(10) Patent No.: US 8,176,443 B2
(45) Date of Patent: May 8, 2012

(54) LAYOUT OF PRINTABLE ASSIST FEATURES TO AID TRANSISTOR CONTROL

(75) Inventors: Benjamen Michael Rathsack, Austin, TX (US); James Walter Blatchford, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 765 days.

(21) Appl. No.: 12/131,370

(22) Filed: Jun. 2, 2008

(65) Prior Publication Data

US 2009/0300567 A1  Dec. 3, 2009

(51) Int. Cl.
*G06F 17/50* (2006.01)

(52) U.S. Cl. ............... 716/50; 716/51; 716/52; 716/53; 716/54; 716/55

(58) Field of Classification Search ............. 716/50–55; 430/5, 22, 30, 394
See application file for complete search history.

(56) References Cited

U.S. PATENT DOCUMENTS

| 2006/0190919 A1* | 8/2006 | Zhang et al. ............... 716/21 |
| 2007/0105387 A1 | 5/2007 | Blatchford et al. |
| 2008/0014684 A1 | 1/2008 | Blatchford et al. |

* cited by examiner

*Primary Examiner* — Paul Dinh
(74) *Attorney, Agent, or Firm* — Alan A. R. Cooper; Warren L. Franz; Frederick J. Telecky, Jr.

(57) ABSTRACT

Exemplary embodiments provide a method for laying out an IC design and the IC design layout. The IC design layout can include one or more gate features placed on an active region including a first pitch (p1) between any two adjacent gate features. Additionally, the IC design layout can include a printable-gate-assist feature placed adjacent to at least one side of the active region, and placed parallel to and at a second pitch (p2) from one first gate feature of the one or more gate features. In various embodiments, a printable-gate-extension feature can be drawn in the design to extend a second gate feature to match a length with a longer neighboring gate feature of the one or more gate features.

8 Claims, 2 Drawing Sheets

LAYOUT OF PRINTABLE ASSIST FEATURES TO AID TRANSISTOR CONTROL

DESCRIPTION OF THE INVENTION

1. Field of the Invention

This invention generally relates to the design of integrated circuit (IC) devices and, more particularly, to IC design layouts including printable-assist features to aid transistor control.

2. Background of the Invention

Conventional optical projection lithography has been the standard silicon patterning technology in semiconductor manufacturing processes, e.g., in integrated circuits (ICs) fabrication. During the lithographic projection, a mask that includes a semiconductor circuit layout pattern can be imaged onto a substrate that is at least partially covered by a layer of resist. Layouts used to create such masks are typically generated using computer-aided design (CAD) programs, sometimes called electronic design automation (EDA). For example, most CAD programs follow a set of predetermined design rules in order to create functional masks.

One goal in IC fabrication is to faithfully reproduce the original circuit design or layout on the wafer using the designed mask. Another goal is to use as much of the wafer real estate as possible. As the size of an IC is reduced and its density increases, however, the critical dimension (CD) of its corresponding mask approaches the resolution limit of the optical exposure tool. For example, transistor matching requirements for advanced technology nodes, such as less than 1.0 µm, require exquisite CD control, beyond the capability of current lithography and etch tools and processes. An important component of variation is matching between gates in the interior of an array of active gates, e.g., over the same active region, and those on the end of the array. For example, for the 45 nm technology node, the CD variation for the end gates in an array of gates can be a factor of 2 to 3 times larger than that of the interior active gates of the array.

Dummy gates are often used to reduce CD variation, e.g., for gates at the end of a gate array. In order to avoid dummy gates interfering with the device performance, dummy gates must be formed far away from the active gates, which take up valuable real estate on the chip. In another example, ghost features are used to reduce the CD variation for example, for gates at the end of a gate array by removing or minimizing the differences in optical proximity correction (OPC), which can be a Resolution-Enhanced optical lithography Technology ("RET") for providing patterns with sub-wavelength resolution. However, the ghost-poly features need to be removed (e.g., etched) after the semiconductor process, which needs an extra step for the semiconductor manufacture and such extra step may damage adjacent active structure on the substrate.

Thus, there is a need to overcome these and other problems of the prior art and to provide an IC design layout and the method for laying out the IC design using printable-assist features to aid transistor control.

SUMMARY OF THE INVENTION

According to various embodiments, the present teachings include a method for laying out an integrated circuit ("IC") design having one or more gate features on an active region and the one or more gate features can include a first pitch (p1) between any two adjacent gate features. In the design, a printable-gate-assist feature can be placed parallel to and at a second pitch (p2) from one gate feature of the one or more gate features, and can be placed in a close proximity to at least one side of the active region.

According to various embodiments, the present teachings also include a method for laying out an IC design. The IC design can include a first gate feature over an active region, where the first gate feature can be one feature of a plurality of gate features. A printable-gate-assist feature can then be placed parallel to and at a pitch (p) spacing away from the first gate feature, and adjacent to at least one side of the active region. In addition, a printable-gate-extension feature that mimics a gate line end extension can be defined and attached to a second gate feature of the plurality of gate features to match a length of a longer neighboring gate feature.

According to various embodiments, the present teachings further include an IC design layout. The IC design layout can include one or more gate features placed on an active region including a first pitch (p1) between any two adjacent gate features. Additionally, the IC design layout can include a printable-gate-assist feature placed adjacent to at least one side of the active region, and placed parallel to and at a second pitch (p2) from one first gate feature of the one or more gate features. Further, a printable-gate-extension feature can be drawn in the design to extend a second gate feature to match a length with a longer neighboring gate feature of the one or more gate features.

Additional objects and advantages of the invention will be set forth in part in the description which follows, and in part will be obvious from the description, or may be learned by practice of the invention. The objects and advantages of the invention will be realized and attained by means of the elements and combinations particularly pointed out in the appended claims.

It is to be understood that both the foregoing general description and the following detailed description are exemplary and explanatory only and are not restrictive of the invention, as claimed.

BRIEF DESCRIPTION OF THE DRAWINGS

The accompanying drawings, which are incorporated in and constitute a part of this specification, illustrate several embodiments of the invention and together with the description, serve to explain the principles of the invention.

DESCRIPTION OF THE EMBODIMENTS

Figure 1:
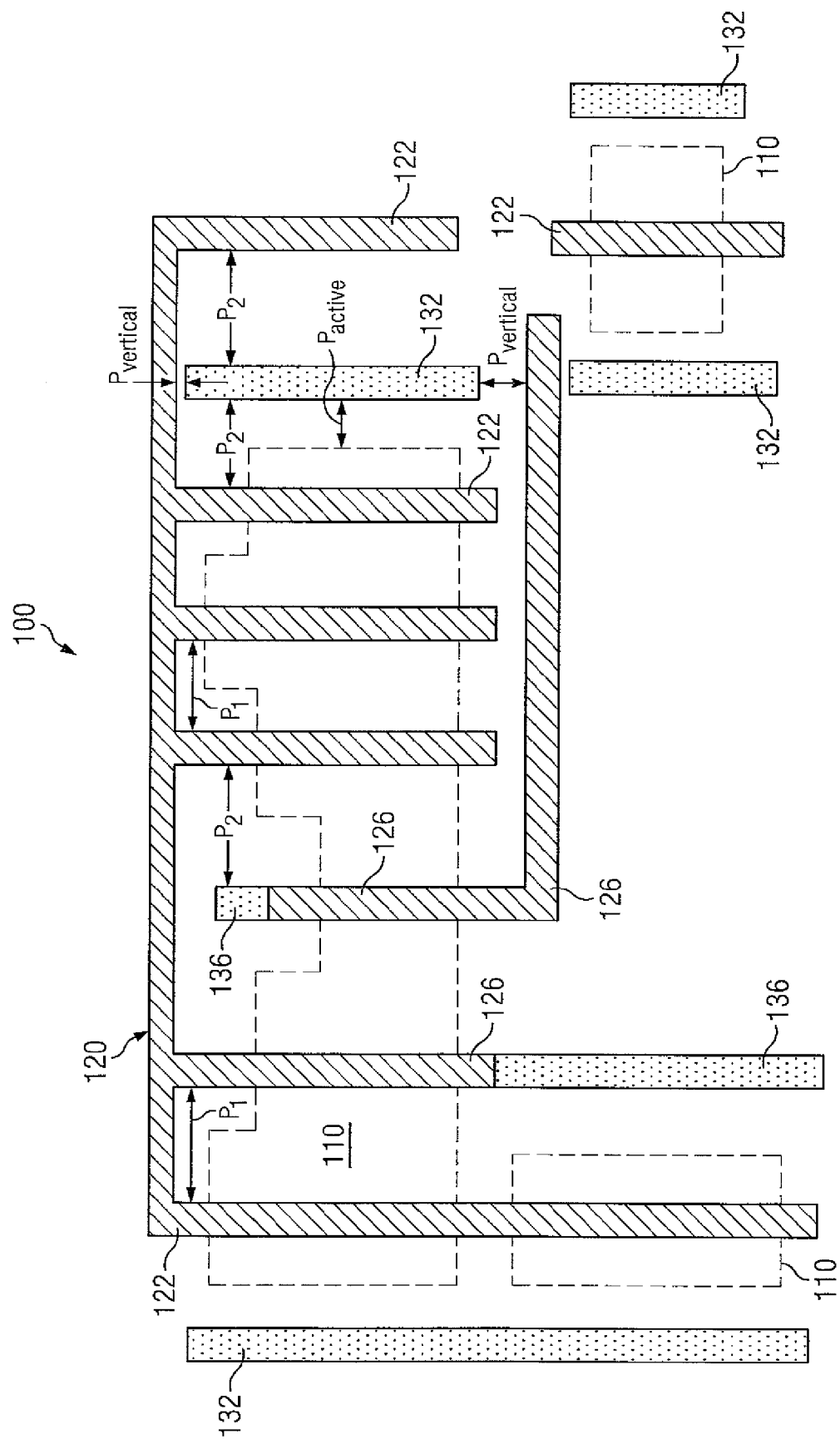
FIG. 1 depicts an exemplary method for laying out an IC design in accordance with the present teachings.

Reference will now be made in detail to the present embodiments (exemplary embodiments) of the invention, examples of which are illustrated in the accompanying drawings. Wherever possible, the same reference numbers will be used throughout the drawings to refer to the same or like parts. In the following description, reference is made to the accompanying drawings that form a part thereof, and in which is shown by Way of illustration specific exemplary embodiments in which the invention may be practiced. These embodiments are described in sufficient detail to enable those skilled in the art to practice the invention and it is to be understood that other embodiments may be utilized and that changes may be made without departing from the scope of the invention. The following description is, therefore, merely exemplary.

While the invention has been illustrated with respect to one or more implementations, alterations and/or modifications can be made to the illustrated examples without departing from the spirit and scope of the appended claims. In addition, while a particular feature of the invention may have been disclosed with respect to only one of several implementations, such feature may be combined with one or more other features of the other implementations as may be desired and advantageous for any given or particular function. Furthermore, to the extent that the terms "including", "includes", "having", "has", "with", or variants thereof are used in either the detailed description and the claims, such terms are intended to be inclusive in a manner similar to the term "comprising." As used herein, the term "one or more of" with respect to a listing of items such as, for example, A and B, means A alone, B alone, or A and B. The term "at least one of" is used to mean one or more of the listed items can be selected.

Not with standing that the numerical ranges and parameters setting forth the broad scope of the invention are approximations, the numerical values set forth in the specific examples are reported as precisely as possible. Any numerical value, however, inherently contains certain errors necessarily resulting from the standard deviation found in their respective testing measurements. Moreover, all ranges disclosed herein are to be understood to encompass any and all sub-ranges subsumed therein. For example, a range of "less than 10" can include any and all sub-ranges between (and including) the minimum value of zero and the maximum value of 10, that is, any and all sub-ranges having a minimum value of equal to or greater than zero and a maximum value of equal to or less than 10, eg., 1 to 5.

As used herein, the term "design" refers to geometric shapes on a mask layout (i.e., a schematic used to make a semiconductor device) that correspond to mask features formed on a mask, and/or features formed in/on the substrate. The mask layout can be used to form a mask that includes mask features that can be used to endow an incoming beam with a patterned cross-section, corresponding to a target pattern that is to be created in/on a target portion of a substrate.

The mask feature can be used to pattern a feature on a substrate. Examples of a semiconductor feature can include a gate, a gate bus, a well, an isolation structure, an interconnect line, a space, a contact hole, a pillar, a resistor, a ghost feature, or any other element of a semiconductor device or other device as will be understood by one of ordinary skill in the art. In various embodiments, a mask feature can include a resolution enhancement technique (RET) design, such as a phase shifter, a sub-resolution assist feature (SRAF), or another optical proximity correction (OPC) technique that assists in forming a feature on the substrate. In an exemplary embodiment, a mask feature can include one or more printable-assist features laid out on a mask design. In various embodiments, multiple mask features can be used to form structures on the substrate. The multiple structures, when finally formed, can combine to form a desired semiconductor feature.

As used herein unless otherwise specified, the term "printable-assist feature" refers to an assist feature laid out from IC mask design and used to improve the critical dimension control when forming semiconductor devices by removing or minimizing the differences in optical proximity correction (OPC) and responses to process variations. Unlike ghost features known in the prior art, the "printable-assist features" can be laid out adjacent to or extended from a semiconductor feature and can remain on the produced final substrate/wafer, while ghost features can be initially formed on a substrate but later removed as described in the related U.S. patent applications, Ser. No. 11/269,633, entitled "Gate Critical Dimension Variation by Use of Ghost Features," and Ser. No. 11/482,041, entitled "Two-Print-Two-Etch Method for Enhancement of CD Control Using Ghost Poly," which are hereby incorporated by references in their entirety.

For example, a "printable-assist feature" can be a "printable-gate-assist feature" formed at the end of a gate array so that the environment at the end of the gate array is similar to the environment in the interior of the gate array. That is, the printable-gate-assist feature can be drawn adjacent to, e.g., any polygate that is not adjacent to any other polygate. In this case, printable-assist features can be used to reduce the critical dimension variation, such as, for example, for gates at the end of a gate array. In anther example, the "printable-assist feature" can be a "printable-gate-extension feature" formed to lengthen gate extensions to match a length of a longer adjacent transistor gate feature.

In various embodiments, printable-assist features, including the printable-gate-assist feature and a printable-gate-extension feature, can be made of the same material as the other features concurrently formed on a substrate or a wafer. In the case of an array of gates made from a layer of polysilicon, for example, the printable-gate-assist feature or the printable-gate-extension feature, can be formed from the same layer of polysilicon. In other instances, however, where the layer is made of another material, such as a metal, a semiconductor, or an insulator, the printable-gate-assist feature or the printable-gate-extension feature can be made of that material.

The disclosed strategic placement of the printable-assist features can enable the highest level of CD control, e.g., for transistor gates. For example, design rules have can be established to layout gates in a grid fashion, so that the control of internal gates on active regions can have the same control as external gates at the edge of active. In addition, printable-gate-assist feature can enable gates at the edge of cell libraries to have the same control as internal density patterned gates. In an exemplary embodiment, the printable-assist features can be placed (e.g., laid out in the mask layout) on a grid layout over shallow trench isolation (e.g., field oxide) to provide good optical diffraction support to adjacent functional gates on active silicon.

In various embodiments, the design layout can include, for example, placing printable-assist features over a defined pitch range determined by simulation, defining line end extensions that mimic gate line end extensions, and attaching extensions to existing gates to support longer neighboring gates. In various embodiments, the disclosed printable-assist features can be remained on the final substrate/wafer and be supported by, e.g., single photo/etch flow as well as double pattern flows where etching other assist feature (e.g., ghost poly) may damage adjacent active silicon in its second etch.

The printable-assist features can provide many advantages. For example, the layout rules can be directly used by design to represent the best lithographic process control of critical transistors. These layout rules can encompass basic lithography principles (e.g., in a grid format) that do not need to be explicitly understood by designers. All designated critical gates can be inherently shielded using these printable-assist features by a single photo/etch process, and, alternatively by a double pattern process. Additionally, the printable-assist features can be optimized to meet process requirement (e.g., size ups/area rules) after the design layout to provide process/OPC teams flexibility, as compared with other solutions in the prior art, which typically provide support of a few transistor cases post layout.

In an exemplary embodiment, an integrated circuit ("IC") design layout can include one or more gate features placed on one or more active regions including a first pitch (p1) between any two adjacent gate features. In addition, the IC design layout can include a printable-gate-assist feature placed adjacent to at least one side of the active region, and placed parallel to and at a second pitch (p2) from one first gate feature of the one or more gate features. Further, in various embodiments, a printable-gate-extension feature can be drawn in the design to extend a second gate feature to match a length with a longer neighboring gate feature of the one or more gate features.

FIG. 1 depicts an exemplary method for laying out an IC design 100 in accordance with the present teachings. It should be readily apparent to one of ordinary skill in the art that the IC design 100 depicted in FIG. 1 represents a generalized schematic illustration and that other features/layers can be added or existing features/layers can be removed or modified.

As shown in FIG. 1, the IC design layout 100 can include a plurality of gate features 120 formed on one or more active regions 110 that have various different shapes and geometries as known to one of ordinary skill in the art. The plurality of gate features 120 can include a first pitch (p1) between any two adjacent gate features. Depending on the semiconductor process and device requirements, the first pitch p1 between any two adjacent gate features can vary. For example, the first pitch (p1) can range from about 170 nm to about 190 nm for a 45 nm logic node, and, from about 114 nm to about 122 nm for a 28 nm logic node.

In various embodiments, the plurality of gate features 120 can include a first gate feature 122, e.g., an end gate of a gate array or any flanked gate feature, and a second gate feature 126 having a shorter length than its neighboring gate. The IC design layout 100 can further include one or more of printable-gate-assist features 132 and printable-gate-extension features 136.

Each printable-gate-assist feature 132 can be placed parallel to one of the first gate features 122 of the gate array, and have a second pitch (p2) therefrom. The printable-gate-assist feature 132 can also be placed adjacent to but not connected with at least one side of the active region that has the one or more gate features or the gate array formed thereon. In various embodiments, the second pitch (p2) between the printable-gate-assist feature 132 and the adjacent first gate feature 122 can range, e.g., from about 170 nm to about 200 nm for the 45 nm logic node, and, e.g., from about 114 nm to about 122 nm for the 28 nm logic node.

In various embodiments, the printable-gate-assist feature 132 can have a width equal or narrower than the minimum width of the adjacent pitched (by p2) gate feature 122. For example, the printable-gate-assist feature 132 can be narrower than the pitched gate feature 122 for about 10 nm or less for the 45 nm logic node. In various embodiments, the printable-gate-assist feature 132 can have a width ranging from about 40 nm to about 60 nm for either the 45 nm logic node or the 32 nm logic node.

In various embodiments, the printable-gate-assist feature 132 can be shorter than the adjacent pitched gate feature 122 and can also have a squarely-cornered gate line end. In some embodiments, the printable-gate-assist feature 132 can have a shorter length of about 210 nm or higher for the 45 nm logic node, when the shorter printable-gate-assist feature has a square corner size of less than about 100 nm. In other embodiments, the printable-gate-assist feature 132 can have a length of about 310 nm or higher for the 45 nm logic node, when the shorter printable-gate-assist feature has a square corner size of about 100 nm or higher.

In embodiments for the 32 nm logic node, the printable-gate-assist feature 132 can have a length of about 150 nm or higher, when the shorter printable-gate-assist feature has a size of the square corner end of less than about 70 nm. On the other hand, the printable-gate-assist feature 132 can include a length of about 210 nm or higher for the 32 nm logic node, when the shorter printable-gate-assist feature has a size of the square corner end of about 70 nm or higher.

In various embodiments, the printable-gate-assist feature 132 can be drawn having a lateral spacing (e.g., $P_{active}$) to an adjacent active region. For example, the lateral spacing ($P_{active}$) can range from about 25 nm to about 85 nm for the 45 nm logic node and can range from about 20 nm to about 60 nm for the 32 nm logic node.

In various embodiments, when a gate feature, e.g., the second gate feature 126, is shorter than the neighboring gate feature of the plurality of gate features 120, a printable-gate-extension feature 136 can be attached to the exemplary second gate feature 126 to match the length of the longer neighboring gate feature in the array. For example, the printable-gate-extension feature 136 can be defined by mimicking a gate line end extension using a computational simulation.

The printable-gate-extension feature 136 can have a width equal or narrower than the second gate feature 126. The printable-gate-extension feature 136 can be, for example, about 20 nm or less, narrower than the second gate feature 126 for the 45 nm logic node, and can be, for example, about 5 nm or less, narrower than the second gate feature 126 for the 32 nm logic node. Note that there can be no minimum run length or minimum area rule for the printable-gate-extension feature 136.

In various embodiments, each of the printable-gate-assist feature 132 and the printable-gate-extension feature 136 can be drawn to have a vertical spacing ($P_{vertical}$) to any gate feature (e.g., 122, or 126) of the one or more gate features 120. The vertical spacing ($P_{vertical}$) can be, for example, about 100 nm for the 45 nm logic node or about 70 nm for the 32 nm logic node. Alternatively, the vertical spacing can be of 0 nm, that is, each of the printable-gate-assist feature 132 and the printable-gate-extension feature 136 can be laid out to connect (but not to overlap) with any one of the gate features (e.g., 122, or 126).

In various embodiments, the vertical spacing ($P_{vertical}$) of each feature of the printable-gate-assist feature 132 and the printable-gate-extension feature 136 to any gate feature of the one or more gate features 120 can be controlled using, eg., a computational program, during the IC design. For example, a computer readable medium can often be used to generate at least a portion of the integrated circuit. The computer readable medium can include program code that can configure a processor to perform various steps used to make the integrated circuit layout.

In an exemplary embodiment, the vertical spacing ($P_{vertical}$) can be controlled by first forming a low initial vertical spacing (e.g., about 0 nm) followed by removing a portion of the printable-assist feature to increase the vertical spacing, using, for example, a pattern generation (PG) extract program or other suitable computational techniques to chop back the initial printable-assist features. For example, the initial vertical spacing can be about 0 nm for the 45 nm logic node, and alternatively, can be at least about 40 nm for the 32 nm logic node. The initial vertical spacing can then be increased by chopping the gate-assist feature to provide a chopped desired vertical spacing, for example, of about 100 nm for the 45 nm logic node and of about 70 nm for the 32 nm logic node using the PG extract program as known to one of ordinary skill in the art.

In various embodiments, the printable-gate-assist feature 132, the printable-gate-extension feature 136, and each gate feature of the gate array 120 can be longer than any adjacent longest active region 110, for example, about 50 nm or longer for the 45 nm logic node, or about 35 nm or longer for the 32 nm logic node, so as to minimize transistor leakage. In various embodiments, the printable-gate-assist feature 132, the printable-gate-extension feature 136, and each gate feature of the gate array 120 can be drawn on a grid of, e.g., about 5 nm. In various embodiments, the printable-gate-assist feature 132, and the printable-gate-extension feature 136 can have same top view or cross sectional shape, for example, a rectangular shape, as that for the gate features 120 of the semiconductor device.

Figure 2:
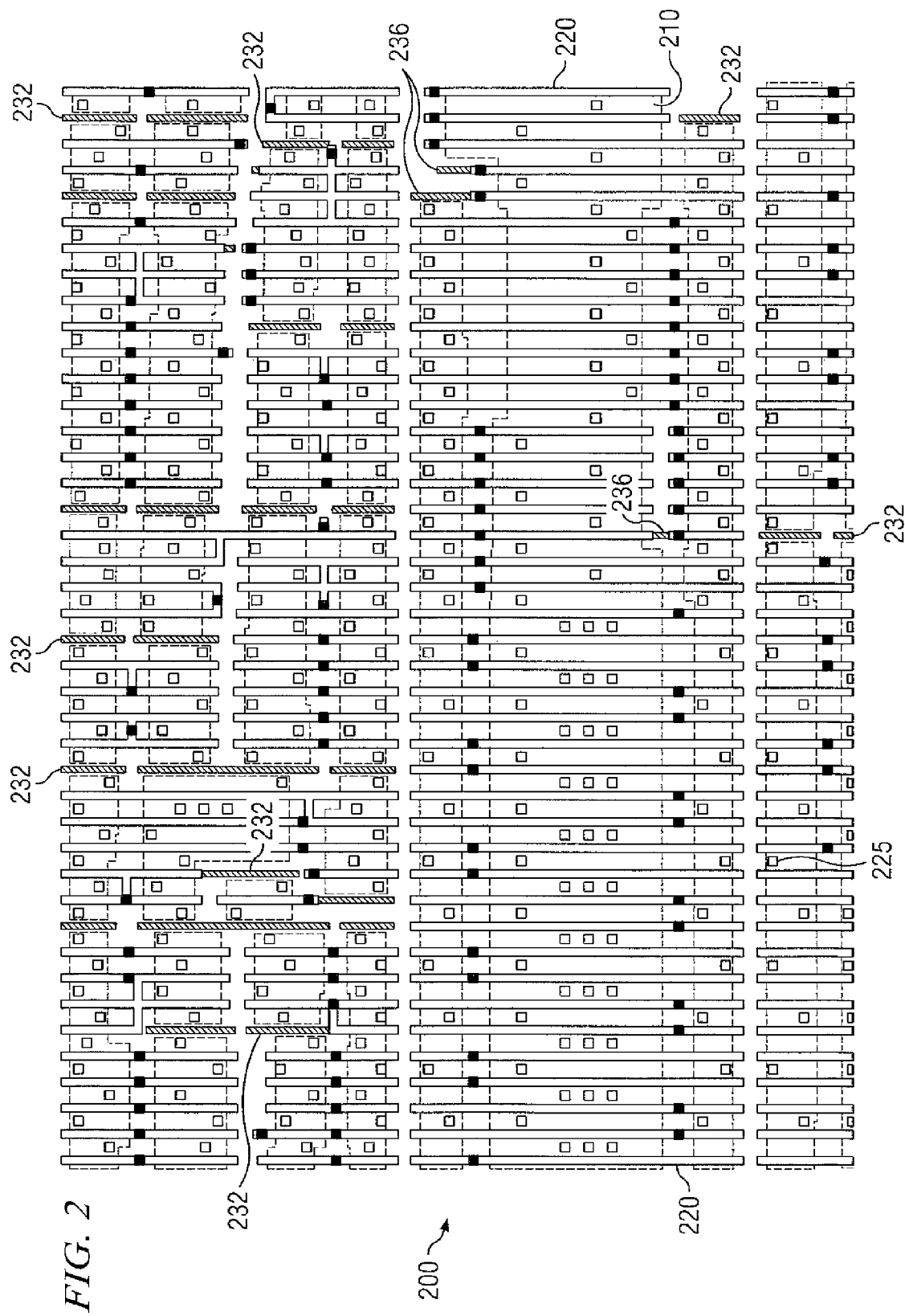
FIG. 2 depicts an exemplary IC design layout in accordance with the present teachings.

FIG. 2 depicts an exemplary IC design layout 200 according to the laying out method 100 as described in FIG. 1 in accordance with the present teachings. As shown, the IC design layout 200 can include a plurality of gate features 220 laid out over the active regions 210. The IC design layout 200 can further include a plurality of contacts 225 that are known to one of ordinary skill in the art. As shown in FIG. 2, a plurality of printable-gate-assist features 232 can be placed adjacent to at least one side of the active region 210, and placed parallel to an adjacent gate feature of the plurality of gate features 220. The IC design layout 200 can also include a plurality of printable-gate-extension features 236 drawn to extend one or more features of the plurality of gate features 220 to match a length with a longer neighboring gate feature of the one or more gate features 220.

Exemplary embodiments can further include an IC device and the method for forming the IC device using the laying out design and method as described in FIGS. 1-2. For example, a photo-mask can be made (e.g., printed) having a mask feature directed by the design layout formed according to the method 100 of FIG. 1. A semiconductor IC feature based on the mask feature can then be printed and formed on a semiconductor substrate. In this manner, the semiconductor substrate can include one or more features corresponding to, e.g., the printable-gate-assist feature, the printable-gate-extension feature, and the desired gate features.

Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A method of fabricating an integrated circuit comprising:
    forming a plurality of circuit first gate features in parallel over an active region of a semiconductor substrate, the first gate features being spaced at a first pitch from each other;
    forming, by using a processor, a photomask printable-gate-assist feature over the substrate in a position adjacent to and spaced from the active region, the printable-gate-assist feature being parallel to and spaced at a second pitch from an adjacent first gate feature;
    forming a circuit second gate feature over the active region, the second gate feature being parallel to the first gate features and having a longest dimension shorter than a corresponding longest dimension of a neighboring first gate feature; and
    forming a photomask printable-gate-extension feature attached to the second gate feature and spaced from the active region, the printable-gate-extension feature extending the longest dimension of the second gate feature to match the corresponding longest dimension of the neighboring first gate feature.

2. The method of claim 1, wherein the first gate features and the printable-gate-assist feature have generally rectangular shapes, and the rectangular shape of the printable-gate-assist feature has a width that is equal to or narrower than a width of the rectangular shape of the adjacent one of the first gate features.

3. The method of claim 2, wherein the printable-gate-extension feature and the second gate feature have generally rectangular shapes, and the rectangular shape of the printable-gate-extension feature has a width that is equal to or narrower than a width of the rectangular shape of the second gate feature.

4. The method of claim 3, wherein the rectangular shape of the printable-gate-assist feature has a length that is shorter than a length of the rectangular shape of the adjacent one of the first gate features.

5. The method of claim 4, wherein the printable-gate-assist feature has a squarely-cornered end.

6. The method of claim 1, wherein the printable-gate-extension feature and the second gate feature have generally rectangular shapes, and the rectangular shape of the printable-gate-extension feature has a width that is equal to or narrower than a width of the rectangular shape of the second gate feature.

7. The method of claim 1, wherein the printable-gate-extension feature and the second gate feature have generally rectangular shapes, and the rectangular shape of the printable-gate-assist feature has a length that is shorter than a length of the rectangular shape of the adjacent one of the first gate features.

8. The method of claim 1, wherein the printable-gate-assist feature has a squarely-cornered end.

* * * * *